(12) United States Patent
Matsuo et al.

(10) Patent No.: US 6,335,645 B1
(45) Date of Patent: Jan. 1, 2002

(54) SEMICONDUCTOR INTEGRATED CIRCUIT HAVING BUILT-IN SELF-TEST CIRCUIT

(75) Inventors: Yukikazu Matsuo, Hyogo; Masami Nakajima; Tetsushi Tanizaki, both of Tokyo, all of (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/593,079

(22) Filed: Jun. 13, 2000

(30) Foreign Application Priority Data

Dec. 27, 1999 (JP) .................................................. 11-371086

(51) Int. Cl.⁷ ...................................................... H03L 7/00
(52) U.S. Cl. ................................................................ 327/141
(58) Field of Search ..................... 327/141, 144, 327/145, 154

(56) References Cited

U.S. PATENT DOCUMENTS

| | | | | |
|---|---|---|---|---|
| 5,987,081 A | * | 11/1999 | Csoppenszky et al. | 375/354 |
| 6,172,538 B1 | * | 1/2001 | Selwan | 327/141 |
| 6,260,152 B1 | * | 7/2001 | Cole et al. | 713/400 |

FOREIGN PATENT DOCUMENTS

| JP | 6-177248 | 6/1994 |
|---|---|---|
| JP | 11-110068 | 4/1999 |

* cited by examiner

*Primary Examiner*—Terry D. Cunningham
*Assistant Examiner*—Quan Tra
(74) *Attorney, Agent, or Firm*—Burns, Doane, Swecker & Mathis, LLP

(57) ABSTRACT

When a level of an asynchronous internal clock enabling signal asynchronous with an external clock signal is risen just after or just before a level change of the external clock signal, a for-synchronization-circuit enabling signal synchronized with the external clock signal is produced in a control signal producing circuit on condition that a level of the for-synchronization-circuit enabling signal is risen at a time which is later than the level change of the external clock signal by two clocks of the external clock signal. Therefore, a reset time-period from the level change of the external clock signal to the level change of the for-synchronization-circuit enabling signal, is obtained. A synchronization circuit is reset in the reset time-period according to the external clock signal and the asynchronous internal clock enabling signal, and, a test signal is produced in the synchronization circuit from the for-synchronization-circuit enabling signal after the reset time-period passes. Therefore, because the for-synchronization-circuit enabling signal is not received from the outsides but is produced, a circuit area of a semiconductor integrated circuit can be efficiently used.

7 Claims, 9 Drawing Sheets

FIG.4
TRUTH VALUE TABLE
d1latcA (WITH RESET)
| CLK | EN | D | Q |
|-----|-----|-----|-----|
| L | L | L | L |
| L | H |   | L |
| H | L |   | Q |
| H | H |   | L |
| L | L | H | H |
| L | H |   | L |
| H | L |   | Q |
| H | H |   | L |
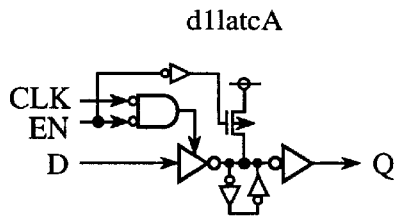
d1latcA
d1latcB (NO RESET)
| CLK | EN | D | Q |
|-----|-----|-----|-----|
| L | L | L | L |
| L | H |   | Q |
| H | L |   | Q |
| H | H |   | Q |
| L | L | H | H |
| L | H |   | Q |
| H | L |   | Q |
| H | H |   | Q |
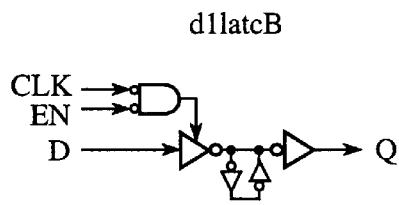
d1latcB
d2latcA (WITH RESET)
| CLK | EN | D | Q |
|-----|-----|-----|-----|
| L | L | L | L |
| L | H |   | Q |
| H | L |   | L |
| H | H |   | L |
| L | L | H | L |
| L | H |   | Q |
| H | L |   | L |
| H | H |   | H |
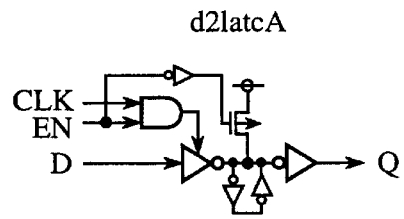
d2latcA
d2latcB (NO RESET)
| CLK | EN | D | Q |
|-----|-----|-----|-----|
| L | L | L | Q |
| L | H |   | Q |
| H | L |   | Q |
| H | H |   | L |
| L | L | H | Q |
| L | H |   | Q |
| H | L |   | Q |
| H | H |   | H |
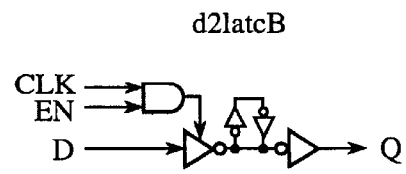
d2latcB

SEMICONDUCTOR INTEGRATED CIRCUIT HAVING BUILT-IN SELF-TEST CIRCUIT

BACKGROUND OF THE INVENTION

1. Field of the Invention

The present invention relates to a semiconductor integrated circuit having a built-in self-test circuit which has both a function for giving a reset time-period required to reset a synchronization circuit of the built-in self-test circuit and a function for producing a test signal to be used to test a tested circuit.

2. Description of Related Art

A built-in test method for performing a self-test of a to-be tested circuit by using a self-test circuit built in a semiconductor chip has been recently paid attention. This self-test circuit has normally a synchronization circuit in which a test signal is produced. To stably output the test signal produced in the synchronization signal to the to-be-tested circuit, it is required to reset the synchronization circuit before the outputting of the test signal. To reset the synchronization circuit, a reset time-period equal to or longer than the one clock of a clock signal is required.

FIG. 11 is a block diagram of a self-test circuit of a conventional semiconductor integrated circuit. As shown in FIG. 11, a reference numeral 111 indicates a synchronization circuit, a reference numeral 112 indicates a self-test circuit including the synchronization circuit 111.

Next, an operation of the conventional semiconductor circuit having the self-test circuit 112 is described with reference to FIG. 12.

FIG. 12 is a timing chart of control signals used in the self-test circuit 112 shown in FIG. 11. In FIG. 12, a symbol EXTCLK (or BISTFCLK) denotes an external clock signal supplied from the outside, symbols ACTCE and ACTLE denote enabling signals, and a symbol INTCLK denotes an internal clock signal.

As shown in FIG. 12, when a level of an enabling signal ACTCE is changed to a high (H) level, an external clock signal EXTCLK (or BISTFCLK) passes through inverters and is supplied to the synchronization circuit 111 as an internal clock signal INTCLK. Therefore, an operation of the synchronization circuit 111 is started. That is, the synchronization circuit 111 is reset according to the internal clock signal INTCLK during a low (L) level of another enabling signal ACTLE (a time-period T121). When a level of the enabling signal ACTLE is changed to the H level after the internal clock signal INTCLK is supplied to the synchronization circuit 111, the synchronization circuit 111 is set to an enabling condition, a test signal set to the H level is produced in the synchronization circuit 111, and the test signal is transmitted to an AND gate. Also, the enabling signal ACTLE set to the H level is supplied to the AND gate, so that the test signal passes through the AND gate and is supplied to a to-be-tested circuit (not shown) such as a static random access memory or a dynamic random access memory (indicated by SDRAM).

As is described above, the reset time-period T121 of the synchronization circuit 111 is obtained according to the two enabling signals ACTCE and ACTLE in the conventional semiconductor integrated circuit.

However, because the two enabling signals ACTCE and ACTLE differ from each other, in cases where the level change of the enabling signal ACTCE is delayed, there is a drawback that the reset time-period T121 required to reset the synchronization circuit 111 cannot be obtained. Also, because the enabling signals ACTCE and ACTLE are required, two wiring areas of the enabling signals ACTCE and ACTLE lead from the outsides are required. Therefore, there is another drawback that a layout area of the semiconductor chip cannot be efficiently used.

SUMMARY OF THE INVENTION

An object of the present invention is to provide, with due consideration to the drawbacks of the conventional semiconductor integrated circuit, a semiconductor integrated circuit having a built-in test circuit in which a reset time-period equal to or more than a prescribed number of clocks required to reset a synchronization circuit is reliably obtained while efficiently using a circuit area of the semiconductor integrated circuit.

The object is achieved by the provision of a semiconductor integrated circuit having a built-in self-test circuit, comprising:

a control signal producing circuit for receiving an external clock signal, receiving a first enabling signal which is asynchronous with the external clock signal and has a level change occurring just after or just before a particular level change of the external clock signal, producing a second enabling signal synchronous with the external clock signal on condition that a level of the second enabling signal is risen at a time which is later than a time of the particular level change of the external clock signal by a prescribed number of clocks of the external clock signal, and outputting the second enabling signal;

a synchronization circuit for receiving the external clock signal according to the level change of the first enabling signal, performing a reset operation in a reset time-period from the time of the particular level change of the external clock signal to the level rising time of the second enabling signal, receiving the second enabling signal produced by the control signal producing circuit, and producing a test signal synchronized with the external clock signal according to the second enabling signal; and first arithmetic logic means for receiving the second enabling signal produced by the control signal producing circuit and the test signal produced by the synchronization circuit, performing a logical multiply operation for the second enabling signal and the test signal to obtain the test signal as a result of the logical multiply operation, and outputting the test signal obtained as a result of the logical multiply operation to a to-be-self-tested circuit.

In the above configuration, a second enabling signal synchronized with an external clock signal is produced by the control signal producing circuit according to the external clock signal and a first enabling signal asynchronous with the external clock signal. In this case, though a level of the second enabling signal is risen according to the level change of the first enabling signal occurring just after or just before the particular level change of the external clock signal, a level rising change of the second enabling signal is delayed, so that the reset time-period from the time of the particular level change of the external clock signal to the time of the level rising change of the second enabling signal is obtained.

Also, a reset operation is performed in the synchronization circuit in the reset time-period, so that the synchronization circuit itself is reset. After the reset time-period passes, a risen level of the second enabling signal is received in the synchronization circuit, and a test signal synchronized with the external clock signal is produced according to the second enabling signal.

Thereafter, a logical multiply operation is performed by the first arithmetic logic means for the second enabling signal and the test signal, and the test signal is obtained as a result of the logical multiply operation. Therefore, the to-be-self-tested circuit can be self-tested according to the test signal.

Accordingly, the reset time-period equal to or more than a prescribed number of clocks of the external clock signal can be reliably obtained, the synchronization circuit can be reliably reset in the reset time-period, and the test signal synchronized with the external clock signal can be stably output.

Also, because the second enabling signal is produced from the first enabling signal and the external clock signal, a wiring for leading the second enabling signal to the built-in self-test circuit is not required, so that a circuit area of the semiconductor integrated circuit can be efficiently used.

It is preferred that the control signal producing circuit comprises a plurality of latch circuits arranged in series, the first enabling signal is used to set the latch circuits to an enabling condition, and the second enabling signal synchronized with the external clock signal is produced in the latch circuits set to the enabling condition according to the first enabling signal.

In the above configuration, the reset time-period is obtained by delaying an output signal of each latch circuit in the latch circuit. Therefore, the reset time-period can be reliably obtained.

It is also preferred that the control signal producing circuit comprises:
  a first system latch circuit having a plurality of first latch circuits arranged in series;
  a second system latch circuit having a plurality of second latch circuits arranged in series;
  second arithmetic logic means for performing a logical multiply for an output signal of the first system latch circuit and an output signal of the second system latch circuit; and
  a third latch circuit for latching an arithmetic result signal of the second arithmetic logic means to delay the arithmetic result signal and outputting the delayed arithmetic result signal as the second enabling signal synchronized with the external clock signal, the first enabling signal is used to set the first latch circuits of the first system latch circuit to an enabling condition, the level of the first enabling signal changing just before the particular level change of the external clock signal is latched in synchronization with the particular level change of the external clock signal in the first latch circuit placed on the first stage of the first system latch circuit, the first enabling signal is used to set the second latch circuits of the second system latch, circuit to an enabling condition, and the level of the first enabling signal changing just after the particular level change of the external clock signal is latched in synchronization with a level change next to the particular level change of the external clock signal in the second latch circuit placed on the first stage of the second system latch circuit.

In the above configuration, the level of the first enabling signal changing just before the particular level change of the external clock signal is latched in synchronization with the particular level change of the external clock signal in the first latch circuit placed on the first stage of the first system latch circuit, and the level of the first enabling signal changing just after the particular level change of the external clock signal is latched in synchronization with a level change next to the particular level change of the external clock signal in the second latch circuit placed on the first stage of the second system latch circuit.

Accordingly, regardless of whether the level change of the first enabling signal occurs just after or just before the particular level change of the external clock signal, the reset time-period from the time of the particular level change of the external clock signal to the level rising time of the second enabling signal can be reliably obtained.

It is also preferred that the control signal producing circuit comprises:
  a selector circuit, connected with the third latch circuit, for maintaining the level of the second enabling signal to a low level until the level of the arithmetic result signal of the second arithmetic logic means is changed to a high level, and outputting the second enabling signal set to a high level after the reset time-period passes.

In the above configuration, the level of the second enabling signal is maintained to a low level until the level of the arithmetic result signal of the second arithmetic logic means is changed to a high level.

Accordingly, the test signal can be stably and reliably sent to the to-be-self-tested circuit after the reset time-period passes.

It is also preferred that the control signal producing circuit further comprises:
  a counter, arranged between the second arithmetic logic means and the third latch circuit, for delaying the arithmetic result signal of the second arithmetic logic means by a second prescribed number of clocks of the external clock signal to prolong the reset time-period, and outputting the delayed arithmetic result signal to the third latch circuit.

In the above configuration, the arithmetic result signal is delayed in the counter. Therefore, the reset time-period determined in the first system latch circuit, the second system latch circuit and the third latch circuit can be arbitrarily adjusted, and the reset time-period arbitrarily adjusted is useful for synchronization circuits in which various reset time-periods are required.

It is also preferred that the semiconductor integrated circuit having the built-in self-test circuit further comprises a clock signal supplying circuit for supplying the external clock signal to the synchronization circuit and the control signal producing circuit and supplying an internal clock signal to the to-be-self-tested circuit, wherein the clock signal supplying circuit comprises:
  a first logical circuit for receiving the external clock signal and outputting the external clock signal to the to-be-self-tested circuit as the internal clock signal in cases where the first enabling signal is set to a first level; and
  a second logical circuit for receiving the external clock signal and the first enabling signal and outputting the external clock signal to the synchronization circuit and the control signal producing circuit in cases where the first enabling signal is set to a second level.

In the above configuration, the external clock signal is not sent from the clock signal supplying circuit to the synchronization circuit or the control signal producing circuit in cases where the first enabling signal is set to the first level, but the external clock signal is sent from the second logical circuit of the clock signal supplying circuit to the synchronization circuit and the control signal producing circuit in cases where the first enabling signal is set to the second level.

Accordingly, because the external clock signal is sent to the synchronization circuit and the control signal producing circuit only when the synchronization circuit and the control signal producing circuit require the external clock signal, an electric power consumed in the semiconductor integrated circuit can be reduced.

It is also preferred that the semiconductor integrated circuit having the built-in self-test circuit further comprises a delaying circuit for delaying the external clock signal output from the second logical circuit of the clock signal supplying circuit to the synchronization circuit by a prescribed time-period to prevent a clock skew between the test signal produced in the synchronization circuit and the internal clock signal output from the first logical circuit of the clock signal supplying circuit.

In the above configuration, the external clock signal output from the second logical circuit of the clock signal supplying circuit to the synchronization circuit and the control signal producing circuit is delayed in the delaying circuit by a prescribed time-period, so that a clock skew between the test signal output from the synchronization circuit and the internal clock signal output from the first logical circuit of the clock signal supplying circuit can be prevented.

Accordingly, a self-test can be correctly performed in the to-be-self-tested circuit according to the test signal and the internal clock signal.

BRIEF DESCRIPTION OF THE DRAWINGS

FIG. 4 is an explanatory diagram of truth value tables of a latch circuit d1latcA, a latch circuit d1latcB, a latch circuit d2latcA and a latch circuit d2latcB composing each of a d1 latch system circuit, a d2 latch system circuit and a common block input circuit shown in FIG. 3;

DETAILED DESCRIPTION OF THE PREFERRED EMBODIMENTS

The invention will now be described with reference to the accompanying drawings.

Embodiment 1

Figure 1:
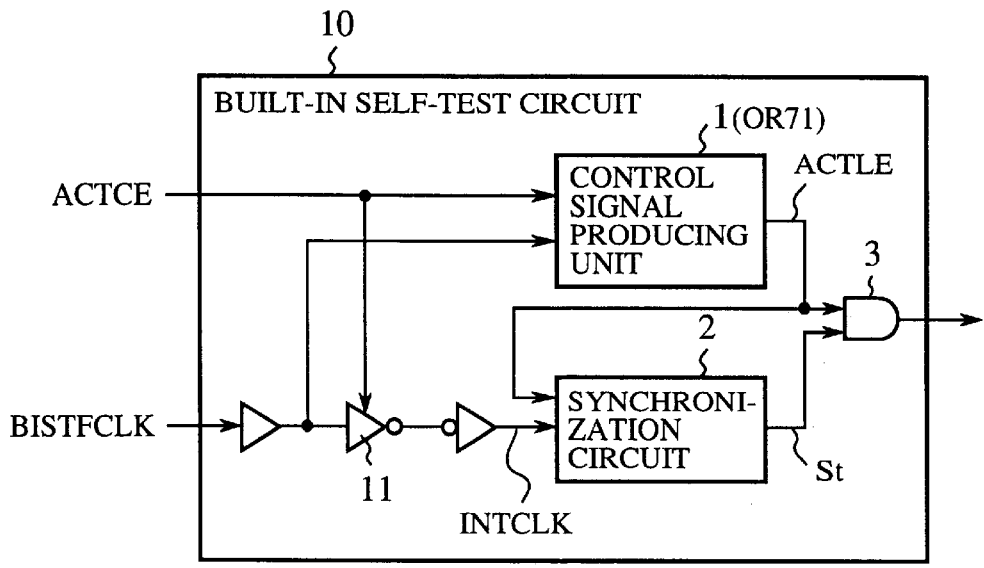
FIG. 1 is a block diagram of a self-test circuit of a semiconductor integrated circuit according to embodiments of the present invention.

FIG. 1 is a block diagram of a built-in self-test circuit of a semiconductor integrated circuit according to embodiments of the present invention.

In FIG. 1, a reference numeral 10 indicates a built-in self-test circuit. A reference numeral 1 (or a reference numeral 71 in a second embodiment) indicates a control signal producing circuit. An external clock signal BISTFCLK and an asynchronous internal clock enabling signal (functioning as a first enabling signal) ACTCE asynchronous with the external clock signal BISTFCLK are input to the control signal producing circuit 1, and an internal clock enabling signal (functioning as a second enabling signal) ACTLE produced in the control signal producing circuit 1 in synchronization with the external clock signal BISTFCLK is output. A reference numeral 2 indicates a synchronization circuit. A reference numeral 3 indicates an AND gate (functioning as a first arithmetic logic means). The enabling signal ACTLE produced in the control signal producing circuit 1 according to the asynchronous internal clock enabling signal ACTCE and the external clock signal BISTFCLK is received in the synchronization circuit 2, so that the enabling signal ACTLE is called an for-synchronization-circuit enabling signal ACTLE. Also, a reference numeral 11 indicates an inverter, and an internal clock signal INTCLK produced from the external clock signal BISTFCLK in the inverted 11, another inverter and a buffer is received in the synchronization circuit 2. A test signal St synchronized with the external clock signal BISTFCLK is produced in the synchronization circuit 2 and is supplied to a to-be-self-tested circuit block (not shown) of a semiconductor chip having the semiconductor integrated circuit.

In the above configuration, an operation of the semiconductor integrated circuit having the built-in self-test circuit is described with reference to FIG. 2.

Figure 2:
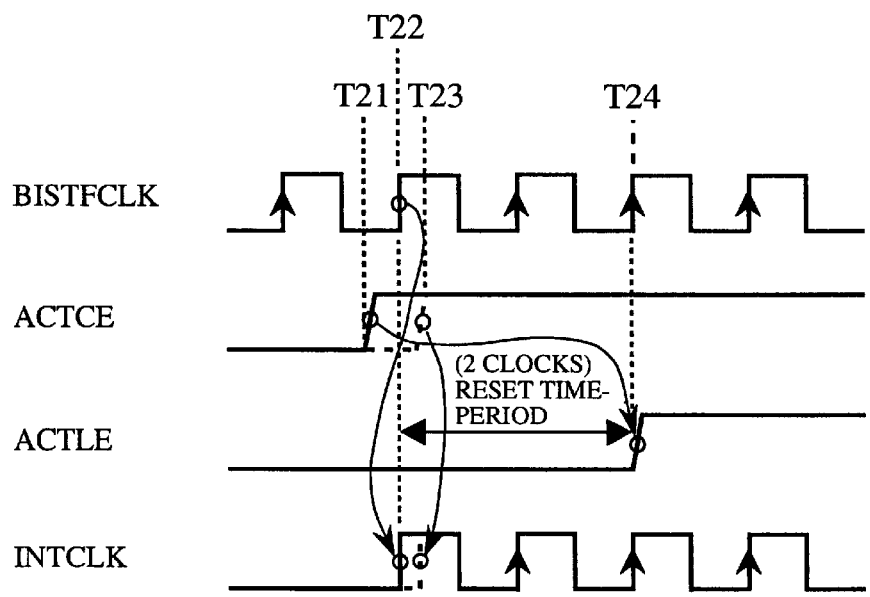
FIG. 2 is a timing chart of various signals respectively output or input from/to a control signal producing circuit or a synchronization circuit shown in FIG. 1.

FIG. 2 is a timing chart of the external clock signal BISTFCLK, the asynchronous internal clock enabling signal ACTCE, the for-synchronization-circuit enabling signal ACTLE and the internal clock signal INTCLK respectively output or input from/to the control signal producing circuit 1 or the synchronization circuit 2.

As shown in FIG. 2, when the asynchronous internal clock enabling signal ACTCE asynchronous with the external clock signal BISTFCLK is changed from the L level to the H level, the inverted 11 is set to an active condition and is turned on. Thereafter, when the level of the external clock signal BISTFCLK is risen, the internal clock signal INTCLK is supplied to the synchronization circuit 2. Therefore, the synchronization circuit 2 is reset during a prescribed reset time-period (for example, a time-period corresponding to two clocks of the external clock signal BISTFCLK).

Also, the external clock signal BISTFCLK and the asynchronous internal clock enabling signal ACTCE asynchronous with the external clock signal BISTFCLK are supplied to the control signal producing circuit 1, and the for-synchronization-circuit enabling signal ACTLE is produced in synchronization with the external clock signal BISTF-CLK after the prescribed reset time-period passes. The for-synchronization-circuit enabling signal ACTLE is supplied to the synchronization circuit 2, and the test signal St synchronized with the external clock signal BISTFCLK is produced in the synchronization circuit 2 from the internal clock signal INTCLK and the enabling signal ACTLE. Thereafter, a logical multiply (indicated by AND) operation is performed for the for-synchronization-circuit enabling signal ACTLE and the test signal St in the AND gate 3, and an AND operation result is sent to the to-be-self-tested circuit block of the semiconductor chip.

Figure 3:
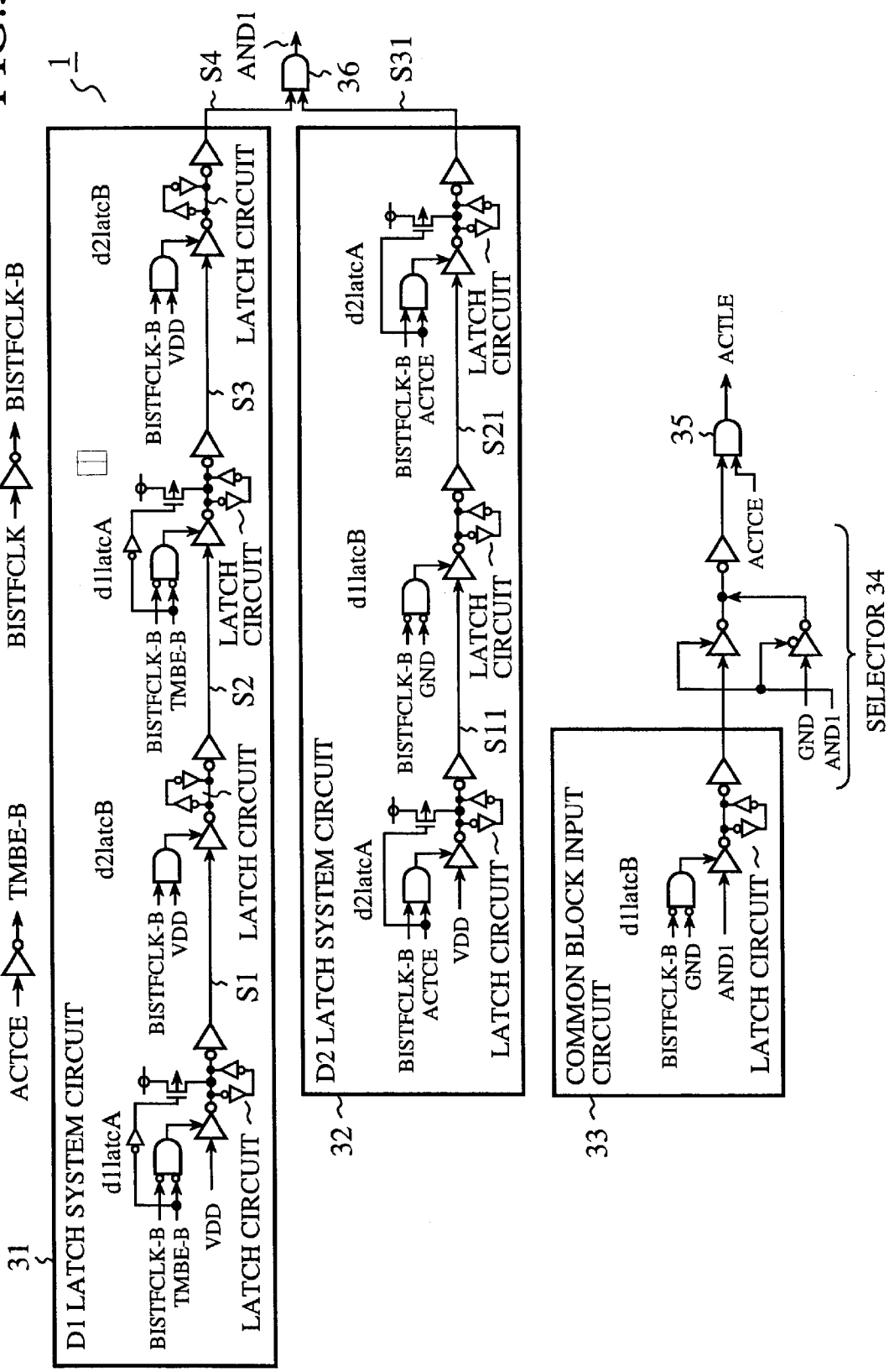
FIG. 3 is a circuit diagram of a control signal producing circuit shown in FIG. 1.

FIG. 3 is a circuit diagram of the control signal producing circuit 1 shown in FIG. 1.

In FIG. 3, a reference numeral 31 indicates a d1 latch system circuit (functioning as a first system latch circuit), a reference numeral 32 indicates a d2 latch system circuit (functioning as a second system latch circuit), a reference numeral 33 indicates a common block input circuit (functioning as a third system latch circuit), a reference numeral 34 indicates a selector, a reference numeral 35 indicates an AND gate, and a reference numeral 36 indicates an AND gate (functioning as a second arithmetic logic means).

The d1 latch system circuit 31 comprises two latch circuits d1latcA and two latch circuits d2latcB arranged in series. The d2 latch system circuit 32 comprises two latch circuits d2latcA and a latch circuit d1latcB arranged in series. The common block input circuit 33 comprises a latch circuit d1latcB. The d1 latch system circuit 31 latches the asynchronous internal clock enabling signal ACTCE in each of the latch circuits d1latcA and the latch circuits d2latcB and outputs the latched internal clock enabling signal as an output signal S4. The d2 latch system circuit 32 latches the asynchronous internal clock enabling signal ACTCE in each of the latch circuits d2latcA and the latch circuits d1latcB and outputs the latched internal clock enabling signal as an output signal S31. The AND gate 36 performs an AND operation for the output signal S4 of the d1 latch system circuit 31 and the output signal S31 of the d2 latch system circuit 32 to produce an arithmetic result AND1. The common block input circuit 33 receives the arithmetic result signal AND1 of the AND gate 36 and an inverted signal BISTFCLK-B of the external clock signal BISTFCLK, latches the arithmetic result signal AND1 and outputs the latched arithmetic result signal AND1 as the for-synchronization-circuit enabling signal ACTLE through the selector 34 and the AND gate 35.

FIG. 4 is an explanatory diagram of truth value tables of the latch circuit d1latcA, the latch circuit d1latcB, the latch circuit d2latcA and the latch circuit d2latcB composing each of the d1 latch system circuit 31, the d2 latch system circuit 32 and the common block input circuit 33 shown in FIG. 3.

In FIG. 4, a clock signal CLK corresponds to the inverted signal BISTFCLK-B of the external clock signal BISTFCLK, and an enabling signal EN corresponds to the asynchronous internal clock enabling signal ACTCE, an inverted signal TMBE-B of the asynchronous internal clock enabling signal ACTCE, a signal VDD of an electric source voltage or a signal GND of a grounded voltage. Also, a signal D corresponds to the signal VDD of the electric source voltage input to the latch circuit placed on the first-stage of each of the d1 latch system circuit 31 and the d2 latch system circuit 32, an output signal of the latch circuit of a preceding stage or the arithmetic result signal AND1 input to the common block input circuit 33. Also, a symbol "Q" used as a level of an output signal Q indicates the same level as a preceding level.

In the above configuration of the control signal producing circuit 1, the operation performed in the control signal producing circuit 1 is described in detail.

The asynchronous internal clock enabling signal ACTCE or the inverted signal TMBE-B of the asynchronous internal clock enabling signal ACTCE is used as the enabling signal EN and a reset signal of each of the latch circuits d1latcA and d2latcA, and an arithmetic logic operation is performed for the asynchronous internal clock enabling signal ACTCE (or its inverted signal TMBE-B) and the inverted signal BISTFCLK-B of the external clock signal BISTFCLK in an AND gate or an NOR gate arranged in each of the latch circuits d1latcA and d2latcA. Therefore, an output signal output from each latch circuit is synchronized with the external clock signal BISTFCLK.

For example, in each latch circuit d1latcA of the d1 latch system circuit 31, an NOR operation between the inverted signal TMBE-B of the asynchronous internal clock enabling signal ACTCE and the inverted signal BISTFCLK-B of the external clock signal BISTFCLK is performed in an NOR gate, and an arithmetic result of the NOR gate is used to activate an inverter placed on an input side of each latch circuit d1latcA. Also, in each latch circuit d2latcA of the d2 latch system circuit 32, an AND operation between the asynchronous internal clock enabling signal ACTCE and the inverted signal BISTFCLK-B of the external clock signal BISTFCLK is performed in an AND gate, and an arithmetic result of the AND gate is used to activate an inverter placed on an input side of each latch circuit d2latcA.

Also, in each latch circuit d1latcB of the d1 latch system circuit 31, an AND operation between the signal VDD of the electric source voltage and the inverted signal BISTFCLK-B of the external clock signal BISTFCLK is performed in an AND gate, and an arithmetic result of the AND gate is used to activate an inverter placed on an input side of each latch circuit d1latcB. Also, in the latch circuit d1latcB of the d2 latch system circuit 32, an NOR operation between the signal GND of the grounded voltage and the inverted signal BISTFCLK-B of the external clock signal BISTFCLK is performed in an NOR gate, and an arithmetic result of the NOR gate is used to activate an inverter placed on an input side of the latch circuit d1latcB.

Therefore, the H level of the asynchronous internal clock enabling signal ACTCE is latched in synchronization with the level change of the external clock signal BISTFCLK, which is changed to the H level, in the latch circuit d1latcA placed on the first stage of the d1 latch system circuit 31, and the H level of the asynchronous internal clock enabling signal ACTCE is latched in synchronization with the level change of the external clock signal BISTFCLK, which is changed to the L level, in the latch circuit d2latcA placed on the first stage of the d2 latch system circuit 32. Because the d1 latch system circuit 31 and the d2 latch system circuit 32, which have the latch circuits d1latcA and d2latcA functioning opposite to each other for the level of the external clock signal BISTFCLK on the first stage, are arranged in parallel to each other in the control signal producing circuit 1, regardless of whether the level change of the asynchronous internal clock enabling signal ACTCE to the H level occurs at a time earlier or later than a time of the level change of the external clock signal BISTFCLK to the H level, the level change of the asynchronous internal clock enabling signal ACTCE to H level can be immediately latched in the control signal producing circuit 1.

Thereafter, an AND operation is performed for the output signals S4 and S31 of the d1 latch system circuit 31 and the d2 latch system circuit 32 in the AND gate 36 to produce an arithmetic result signal AND1, and the arithmetic result signal AND1 is output to the selector 34. In this case, because the arithmetic result signal AND1 is used as an enabling signal in the selector 34 to activate an inverter, the level of the for-synchronization-circuit enabling signal ACTLE can be fixed to the L level while the level change of the for-synchronization-circuit enabling signal ACTLE is delayed in the latch circuits of the d1 latch system circuit 31 and the d2 latch system circuit 32 (until a time earlier by a half clock than a time T24 shown in FIG. 2) after the level of the asynchronous internal clock enabling signal ACTCE is changed to the H level (a time T21 or a time T23 shown in FIG. 2).

Thereafter, the for-synchronization-circuit enabling signal ACTLE is output from the control signal producing circuit 1 to the AND gate 3 at the time T24. Therefore, the test signal St output from the synchronization circuit 2 can be stably and reliably sent to the to-be-self-tested circuit block of the semiconductor chip through the AND gate 3.

Figure 5:
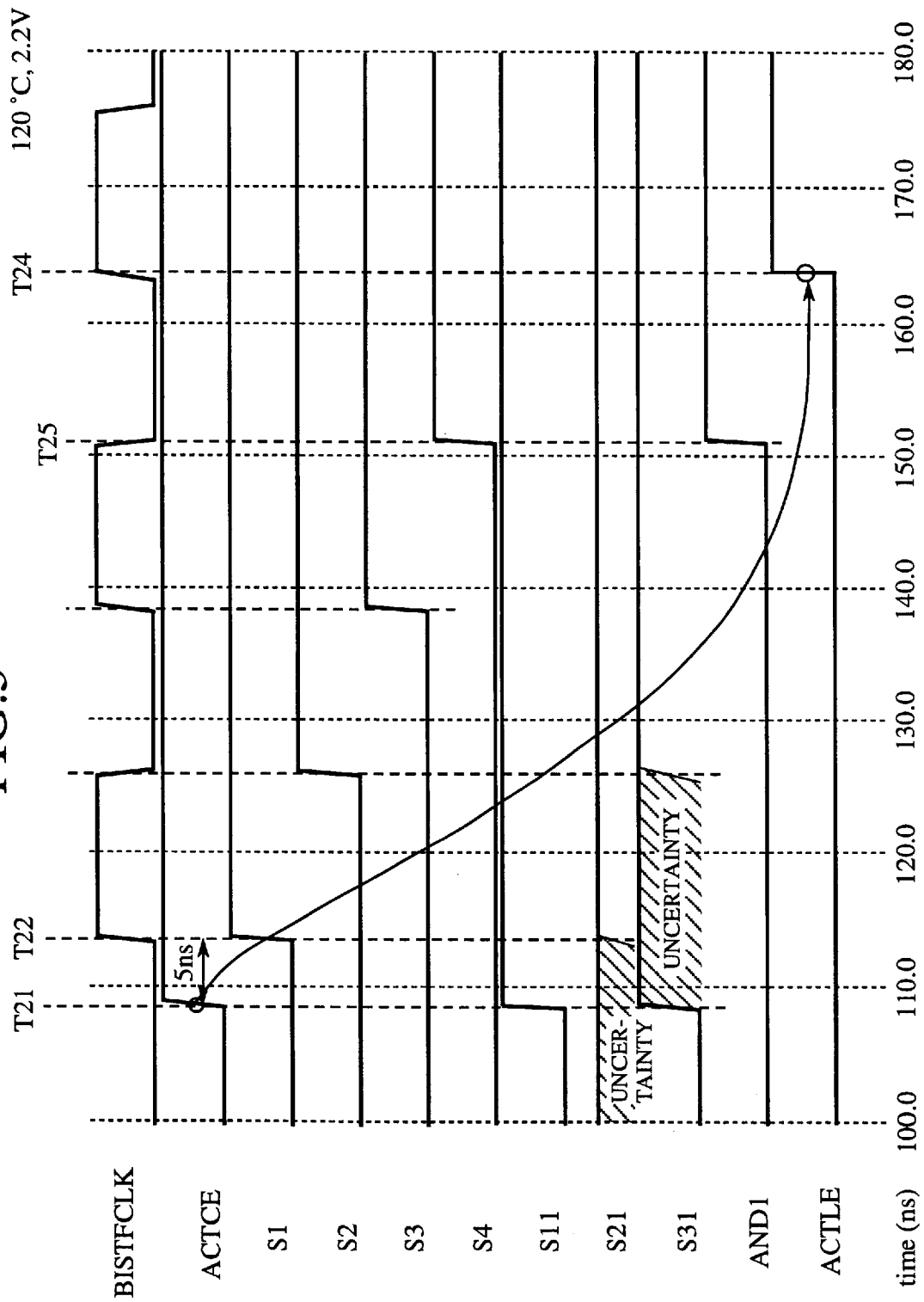
FIG. 5 is a timing chart of various signals obtained by simulating the operation of a d1 latch system circuit and the operation of a d2 latch system circuit shown in FIG. 3 in cases where a rising-up of the level of an asynchronous internal clock enabling signal ACTCE is earlier than a rising-up of an external clock signal BISTFCLK by 5 nanosecond.
Figure 6:
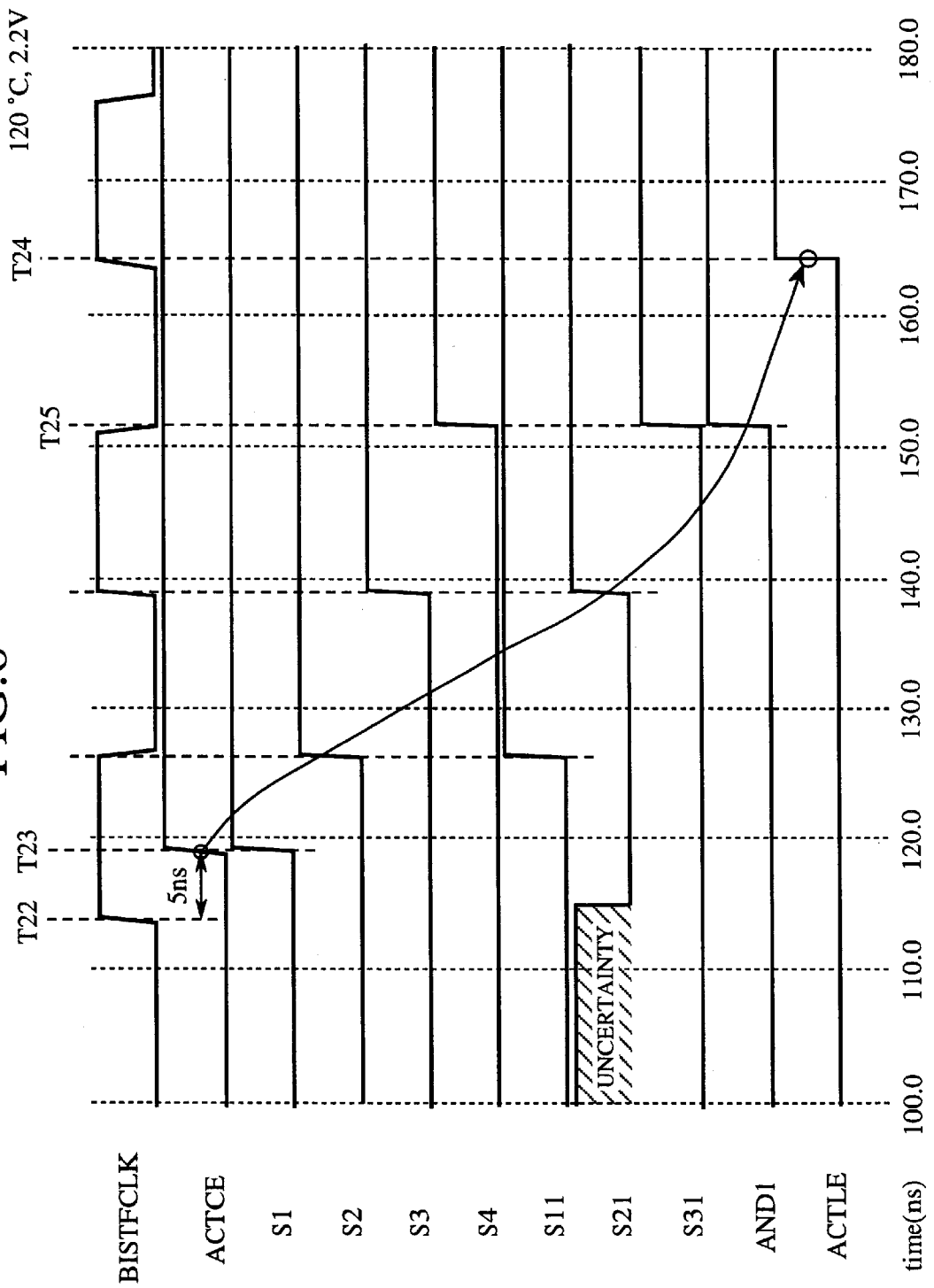
FIG. 6 is a timing chart of various signals obtained by simulating the operation of a d1 latch system circuit and the operation of a d2 latch system circuit shown in FIG. 3 in cases where a rising-up of the level of an asynchronous internal clock enabling signal ACTCE is later than a rising-up of an external clock signal BISTFCLK by 5 nanosecond.

FIG. 5 and FIG. 6 are respectively a timing chart of the external clock signal BISTFCLK, the asynchronous internal clock enabling signal ACTCE, the output signals S1, S2, S3 and S4 of the d1 latch system circuit 31 shown in FIG. 3, the output signals S11, S21 and S31 of the d2 latch system circuit 32 shown in FIG. 3, the arithmetic result signal AND1 of the AND gate 36 shown in FIG. 3 and the for-synchronization-circuit enabling signal ACTLE. The timing chart of FIG. 5 is obtained by simulating the operation of the d1 latch system circuit 31 and the operation of the d2 latch system circuit 32 in cases where a rising-up (occurring at the time T21) of the level of the asynchronous internal clock enabling signal ACTCE is earlier than a rising-up (occurring at the time T22) of the external clock signal BISTFCLK by 5 nanosecond. The timing chart of FIG. 6 is obtained by simulating the operation of the d1 latch system circuit 31 and the operation of the d2 latch system circuit 32 in cases where a rising-up (occurring at the time T23) of the level of the asynchronous internal clock enabling signal ACTCE is later than a rising-up (occurring at the time T22) of the external clock signal BISTFCLK by 5 nanosecond.

As shown in FIG. 5, in cases where the level of the asynchronous internal clock enabling signal ACTCE is risen at the time T21 earlier than the rising-up of the external clock signal BISTFCLK at the time T22, the level change of the output signal S1 is delayed to the time T22, the level of the output signal S2 is changed to the H level in synchronization with a falling-down of the external clock signal BISTFCLK, the level of the output signal S3 is changed to the H level in synchronization with a next rising-up of the external clock signal BISTFCLK, and the level of the output signal S4 is changed to the H level in synchronization with a next falling-down of the external clock signal BISTFCLK. Because the level of the output signal S31 is maintained to the H level, the level of the arithmetic result signal AND1 is changed to the H level in synchronization with the level change of the output signal S4, and the level of the for-synchronization-circuit enabling signal ACTLE is changed to the H level at the time T24.

Also, as shown in FIG. 6, in cases where the level of the asynchronous internal clock enabling signal ACTCE is risen at the time T23 later than the rising-up of the external clock signal BISTFCLK at the time T22, the level of the output signal S1 is immediately changed to the H level, the levels of the output signals S2 and S11 are respectively changed to the H level in synchronization with a falling-down of the external clock signal BISTFCLK, the levels of the output signals S3 and S21 are respectively changed to the H level in synchronization with a next rising-up of the external clock signal BISTFCLK, the levels of the output signals S4 and S31 are respectively changed to the H level in synchronization with a next falling-down of the external clock signal BISTFCLK, the level of the arithmetic result signal AND1 is changed to the H level in synchronization with the level change of the output signals S4 and S31, and the level of the for-synchronization-circuit enabling signal ACTLE is changed to the H level at the time T24.

Therefore, regardless of whether the rising-up of the asynchronous internal clock enabling signal ACTCE is earlier or later than the rising-up of the external clock signal BISTFCLK at the time T22, the level of the for-synchronization-circuit enabling signal ACTLE can be reliably changed to the H level when the time passes by two clocks of the external clock signal BISTFCLK after the rising-up of the external clock signal BISTFCLK at the time T22.

In the control signal producing circuit 1, the number of latch circuits in the d1 latch system circuit 31 is 4, and the number of latch circuits in the d2 latch system circuit 32 is 3 lower than that in the d1 latch system circuit 31 by one. Therefore, regardless of whether the rising-up (occurring at the time T21 or T23) of the asynchronous internal clock enabling signal ACTCE is earlier or later than the rising-up (occurring at the time T22) of the external clock signal BISTFCLK, the level of the for-synchronization-circuit enabling signal ACTLE can be changed to the H level at the time T24 which is later than the time T22 by two clocks of the external clock signal BISTFCLK.

Accordingly, because the for-synchronization-circuit enabling signal ACTLE, of which the level is changed to the H level at the time T24 which is later than the rising-up (occurring at the time T22) of the external clock signal BISTFCLK by two clocks of the external clock signal BISTFCLK, is produced in the control signal producing circuit 1 according to the external clock signal BISTFCLK and the asynchronous internal clock enabling signal ACTCE asynchronous with the external clock signal BISTFCLK and is input to the synchronization circuit 2 at the time T24 to be used as an enabling signal for the internal clock signal INTCLK input to the synchronization circuit 2, the synchronization circuit 2 can be reliably reset in the reset time-period from the time T22 to the time T24 according to the internal clock signal INTCLK obtained by using the asynchronous internal clock enabling signal ACTCE as an enabling signal. Also, the test signal St can be stably produced in the synchronization circuit 2 in synchronization with the internal clock signal INTCLK according to the for-synchronization-circuit enabling signal ACTLE to test the to-be-self-tested circuit block of the semiconductor chip.

Also, because the for-synchronization-circuit enabling signal ACTLE synchronized with the external clock signal BISTFCLK is produced from the asynchronous internal clock enabling signal ACTCE asynchronous with the external clock signal BISTFCLK, the number of signals input to the built-in self-test circuit 10 can be reduced, a wiring used for leading the for-synchronization-circuit enabling signal ACTLE to the built-in self-test circuit 10 is not required, so that an area of the semiconductor integrated circuit required to lead the wiring of the signals can be reduced. Therefore, the circuit area of the semiconductor integrated circuit can be efficiently used.

In this embodiment, four latch circuits in the d1 latch system circuit 31 and three latch circuits in the d2 latch system circuit 32 are arranged in the control signal producing circuit 1 to obtain the reset time-period corresponding to two clocks of the external clock signal BISTFCLK. However, the number of latch circuits is not limited, and it is applicable that the number of latch circuits be increased to prolong the reset time-period on condition that the number of latch circuits in the d1 latch system circuit 31 is higher than the number of latch circuits in the d2 latch system circuit 32 by one.

Embodiment 2

Figure 7:
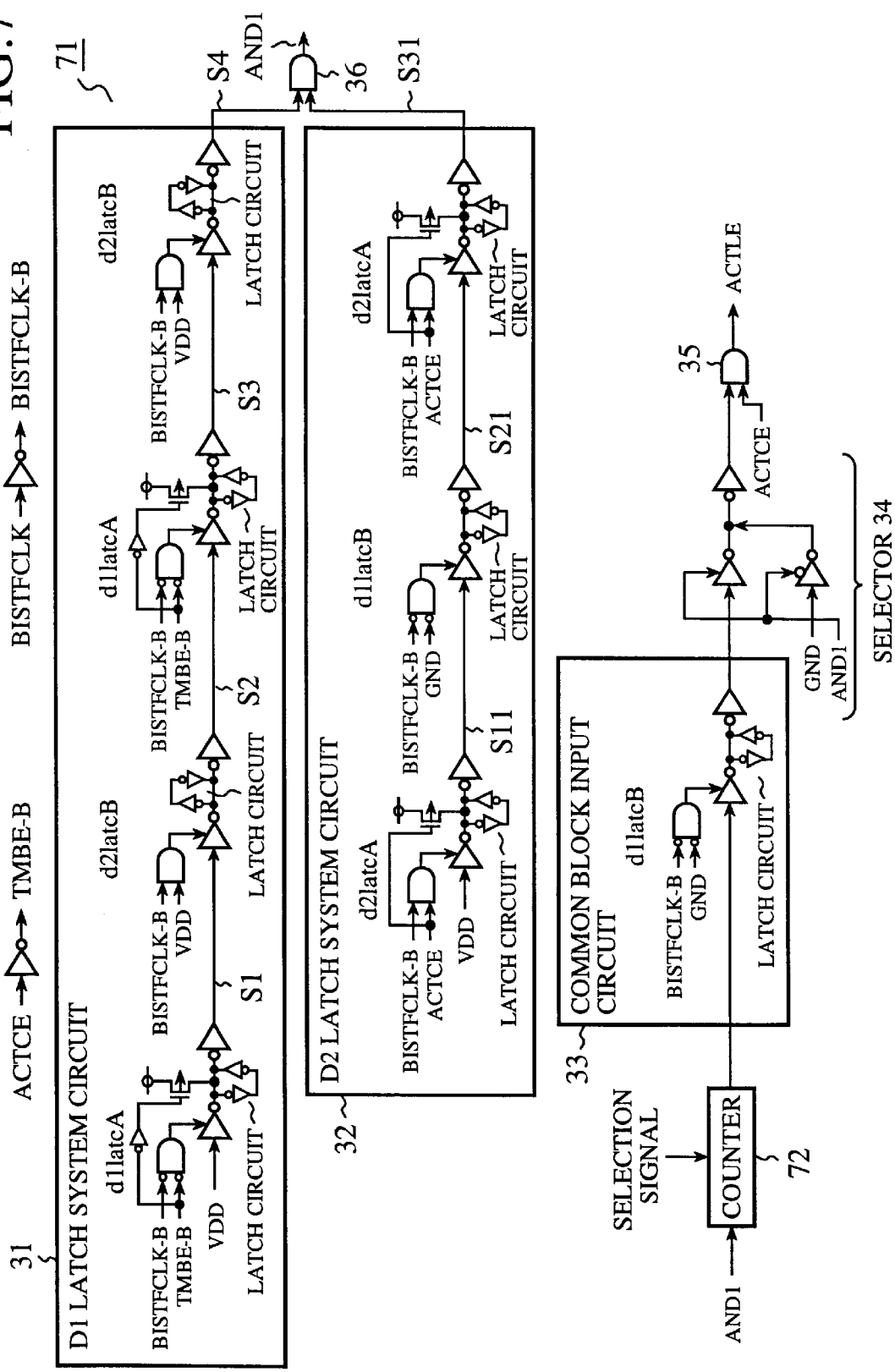
FIG. 7 is a circuit diagram of a control signal producing circuit of the semiconductor integrated circuit having the built-in self-test circuit shown in FIG. 1 according to a second embodiment of the present invention.

FIG. 7 is a circuit diagram of a control signal producing circuit 71 of a semiconductor integrated circuit having a built-in self-test circuit shown in FIG. 1 according to a second embodiment of the present invention.

In FIG. 7, a reference numeral 72 indicates a counter. The counter 72 comprises a prescribed number of latch circuits arranged in series and is arranged between the AND gate 36 and the common block input circuit 33. Because the latch circuits of the counter 72 is the same as those used in the d1 latch system circuit 31 or the d2 latch system circuit 32, the detail configuration of the counter 72 is omitted.

In the counter 71, a selection signal is received from a control means such as a central processing unit (not shown), the arithmetic result signal AND1 output from the AND gate 36 is received, the arithmetic result signal AND1 is delayed to prolong the reset time-period, and the delayed arithmetic result signal AND1 is output to the common block input circuit 33.

Because the other constitutional elements of the control signal producing circuit 71 are the same as those of the control signal producing circuit 1 in the first embodiment, the same reference numerals as those in the first embodiment are used to indicate the other constitutional elements in the second embodiment, and the description of the other constitutional elements are omitted.

In the above configuration, an operation of the control signal producing circuit 71 is described.

The reset time-period equal to two clocks of the external clock signal BISTFCLK in the first embodiment is determined by the number of latch circuits arranged in series. Therefore, in this embodiment, to set a reset time-period more than two clocks of the external clock signal BISTFCLK, the reset time-period is adjusted by using the counter 72. In detail, one or more latch circuits arranged in series are selected from all latch circuits arranged in the counter 72 according to the selection signal, and the arithmetic result signal AND1 is delayed in the selected latch circuits arranged in series to prolong the reset time-period. Thereafter, the delayed arithmetic result signal AND1 is output to the common block input circuit 33, so that a for-synchronization-circuit enabling signal ACTLE is output to the synchronization circuit 2 and the AND gate 3 in the same manner as in the first embodiment.

Accordingly, because the counter 72 is arranged between the AND gate 36 and the common block input circuit 33 and because the number of latch circuits arranged in the counter 72 in series is adjusted according to the selection signal, the arithmetic result signal AND1 passing through the selected latch circuits arranged in the counter 72 in series is delayed. Therefore, the reset time-period can be arbitrarily adjusted, and the reset time-period arbitrarily adjusted is useful for synchronization circuits in which various reset time-periods are required.

Also, in the same manner as in the first embodiment, the synchronization circuit 2 can be reliably reset during the reset time-period, the test signal St can be stably output from the synchronization circuit 2 after the reset time-period passes, and the circuit area of the semiconductor integrated circuit can be efficiently used.

Embodiment 3

In the first and second embodiments, the external clock signal BISTFCLK is always supplied to the built-in self-test circuit 10. However, in a third embodiment, the external clock signal BISTFCLK is supplied to the built-in self-test circuit 10 only when the self-test of the to-be-self-tested circuit block is performed.

Figure 8:
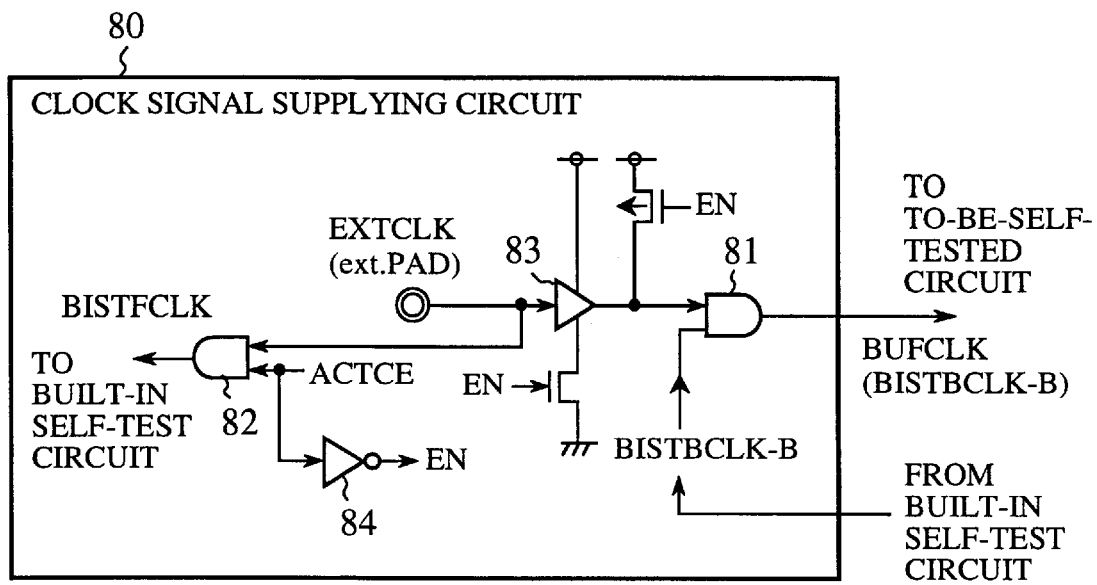
FIG. 8 is a circuit diagram of a clock signal supplying circuit arranged in the semiconductor integrated circuit having the built-in self-test circuit shown in FIG. 1 according to a third embodiment of the present invention.

FIG. 8 is a circuit diagram of a clock signal supplying circuit arranged in the semiconductor integrated circuit having the built-in self-test circuit shown in FIG. 1 according to a third embodiment of the present invention.

In FIG. 8, a reference numeral 80 indicates a clock signal supplying circuit, a reference numeral 81 indicates an AND gate (functioning as a first logical circuit), a reference numeral 82 indicates an AND gate (functioning as a second logical circuit), a reference numeral 83 indicates a buffer, and a reference numeral 84 indicates an inverter. The clock signal supplying circuit 80 supplies the external clock signal BISTFCLK to the synchronization circuit 2 and the control signal producing circuit 1 of the built-in self-test circuit 10 and supplies an internal clock signal BUFCLK or an inverted signal BISTBCLK-B of an internal clock signal BISTBCLK to the to-be-self-tested circuit block. A symbol ext.PAD indicates an external pad, and an external clock signal EXTCLK is input to the clock signal supplying circuit 80 from the outsides through the external pad ext.PAD and is supplied to the built-in self-test circuit 10 through the AND gate 82 as the external clock signal BISTFCLK.

Next, an operation of the clock signal supplying circuit 80 is described with reference to FIG. 9.

Figure 9:
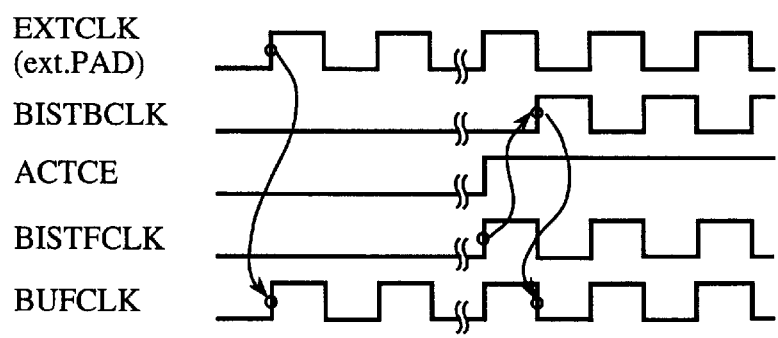
FIG. 9 is a timing chart of various signals used in the clock signal supplying circuit shown in FIG. 8.

FIG. 9 is a timing chart of the external clock signal EXTCLK, the internal clock signal BISTBCLK, the asynchronous internal clock enabling signal ACTCE, the external clock signal BISTFCLK and the internal clock signal BUFCLK used in the clock signal supplying circuit 80.

The inverted signal BISTBCLK-B of the internal clock signal BISTBCLK is output from the built-in self-test circuit 10 and is input to the AND gate 81. Also, the external clock signal EXTCLK is input to the AND gate 81 through the buffer 83, an AND operation is performed in the AND gate 81 for the inverted signal BISTBCLK-B and the external clock signal EXTCLK to produce the internal clock signal BUFCLK as a result of the AND operation, and the internal clock signal BUFCLK is directly supplied to the to-be-self-tested circuit block.

Also, an AND operation is performed in the AND gate 82 for the external clock signal EXTCLK and the asynchronous internal clock enabling signal ACTCE to produce the external clock signal BISTFCLK as a result of the AND operation, and the external clock signal BISTFCLK is output to the built-in self-test circuit 10.

As shown in FIG. 9, in cases where the self-test of the to-be-self-tested circuit block is not performed, a level of the asynchronous internal clock enabling signal ACTCE is maintained to the L level (or a first level). In this case, the external clock signal EXTCLK input to the external pad ext.PAD is supplied to the to-be-self-tested circuit block such as SDRAM through the buffer 83 and the AND gate 81. Also, because a logical multiply is performed in the AND gate 82 according to the asynchronous internal clock enabling signal ACTCE set to the L level, the external clock signal BISTFCLK is not output from the AND gate 82 to the built-in self-test circuit 10.

In contrast, in cases where the self-test of the to-be-self-tested circuit block is performed, a level of the asynchronous internal clock enabling signal ACTCE is changed to the H level (or a second level). In this case, the external clock signal BISTFCLK is output from the AND gate 82 to the synchronization circuit 2 and the control signal producing circuit 1 (or 71) of the built-in self-test circuit 10. Also, a control signal EN set to the L level is produced from the asynchronous internal clock enabling signal ACTCE in the converter 84, and the transmission of the external clock signal EXTCLK to the AND gate 81 is stopped by the buffer 83 according to the control signal EN, and an electric source voltage VDD is applied to the AND gate 81 in place of the external clock signal EXTCLK according to the control signal EN. Therefore, the inverted signal BISTBCLK-B of the internal clock signal BISTBCLK output from the built-in self-test circuit 10 is supplied to the to-be-self-tested circuit block through the AND gate 81.

Accordingly, because the clock signal supplying circuit 80 is additionally arranged in the semiconductor integrated circuit having the built-in self-test circuit. 10, the external clock signal BISTFCLK is output from the clock signal supplying circuit 80 to the built-in self-test circuit 10 only when the self-test of the to-be-self-tested circuit block is performed by operating the built-in self-test circuit 10, an electric power consumed in the built-in self-test circuit 10 can be reduced.

Embodiment 4

Figure 10:
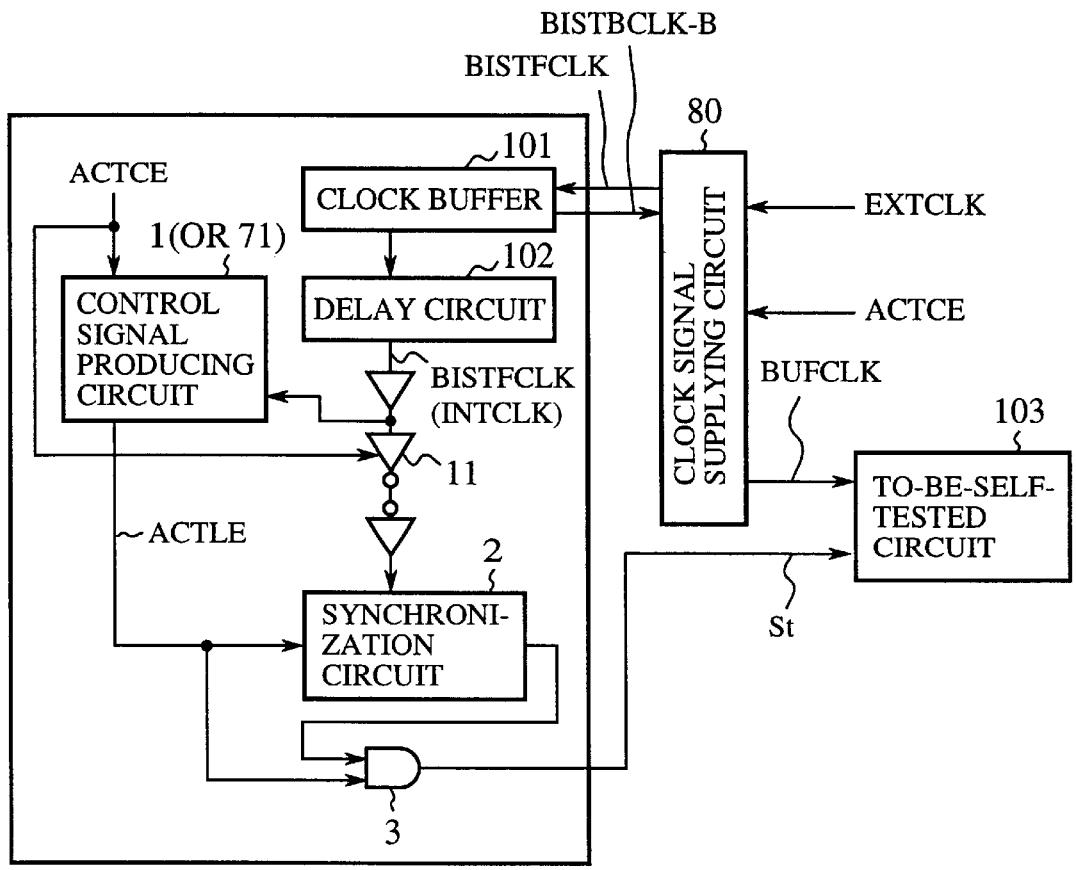
FIG. 10 is a block diagram of a semiconductor integrated circuit having a built-in self-test circuit according to a fourth embodiment of the present invention.
Figure 11:
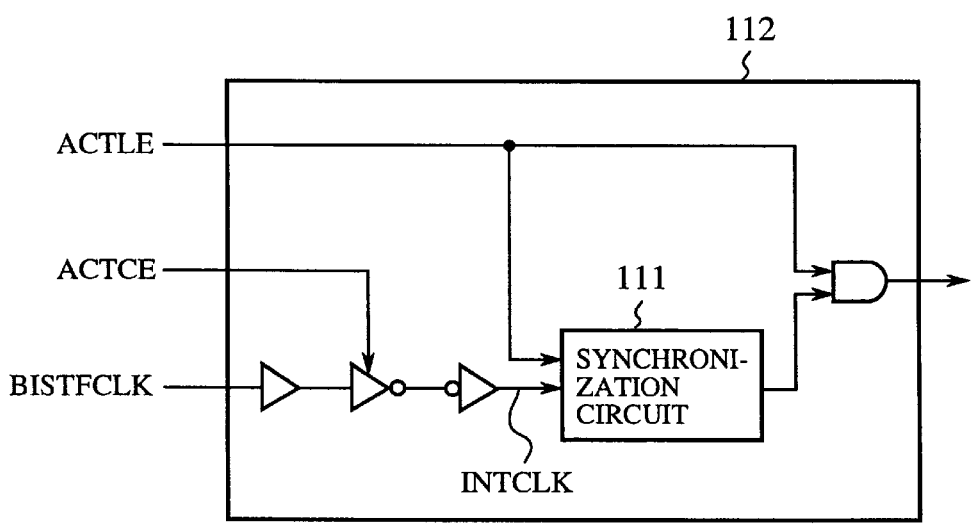
FIG. 11 is a block diagram of a self-test circuit of a conventional semiconductor integrated circuit.
Figure 12:
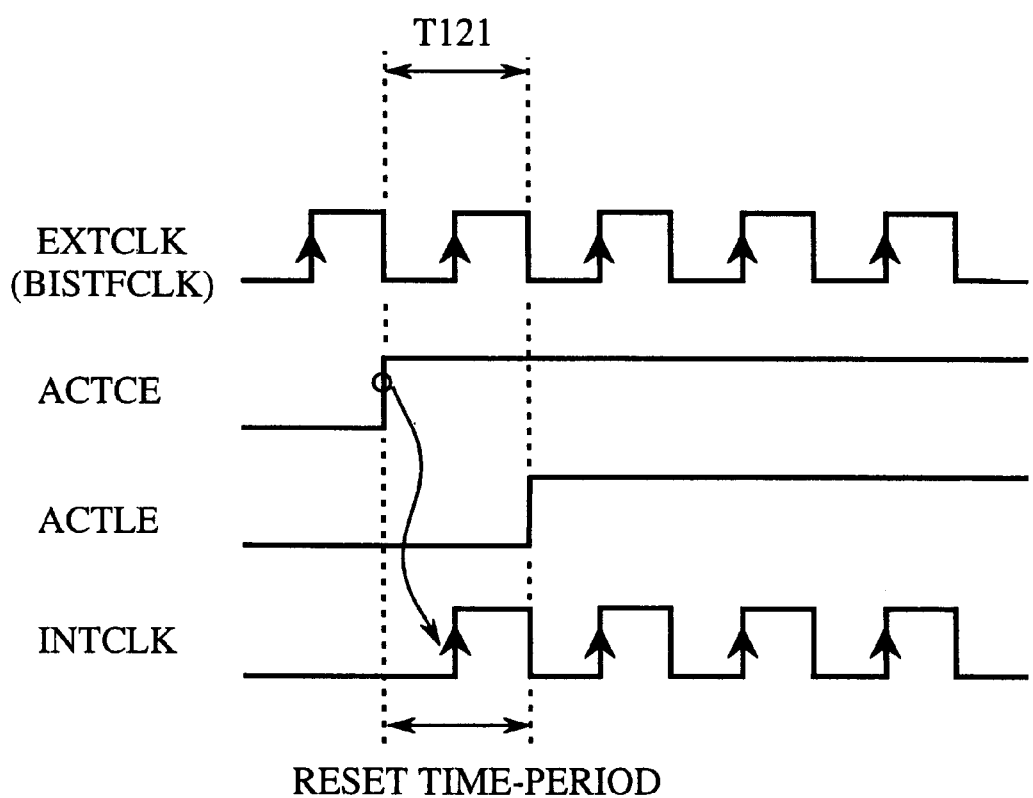
FIG. 12 is a timing chart of control signals used in the self-test circuit 112 shown in FIG. 11.

FIG. 10 is a block diagram of a semiconductor integrated circuit having a built-in self-test circuit according to a fourth embodiment of the present invention.

In FIG. 10, a reference numeral 101 indicates a clock buffer, a reference numeral 102 indicates a delay circuit, and a reference numeral 103 indicates a to-be-self-tested circuit such as SDRAM. The to-be-self-tested circuit 103 denotes the to-be-self-tested circuit block of the first to third embodiments.

Because the other constitutional elements of the semiconductor integrated circuit are the same as those of the semiconductor integrated circuit in the first to third embodiments, the same reference numerals as those in the first to third embodiments are used to indicate the other constitutional elements in the forth embodiment, and the description of the other constitutional elements are omitted.

Next, an operation of the semiconductor integrated circuit having the built-in self-test circuit is described.

The clock buffer 101 receives the external clock signal BISTFCLK from the AND gate 82 of the clock signal supplying circuit 80, outputs the external clock signal BISTFCLK to the delaying circuit 102 and outputs the inverted signal BISTBCLK-B of the internal clock signal BISTBCLK to the AND gate 81 of the clock signal supplying circuit 80.

The delaying circuit 102 delays the external clock signal BISTFCLK sent from the clock buffer 101 by a prescribed time-period and outputs the delayed external clock signal BISTFCLK to the synchronization circuit 2 as the internal clock signal INTCLK. Because the external clock signal BISTFCLK is delayed in the delaying circuit 102 by the prescribed time-period, no clock skew between the test signal St output from the synchronization circuit 2 to the to-be-self-tested circuit 103 through the AND gate 3 and the internal clock signal BUFCLK output from the clock signal supplying circuit 80 to the to-be-self-tested circuit 103 occurs. That is, a rise time of the test signal St agrees with a rise time of the internal clock signal BUFCLK.

Accordingly, because the clock buffer 101 and the delaying circuit 102 are additionally arranged in the built-in self-test circuit to prevent the occurrence of a clock skew between the test signal St produced in the synchronization circuit 2 and the internal clock signal BUFCLK output from the clock signal supplying circuit 80, the test signal St and the internal clock signal BUFCLK synchronized with each other can be sent to the to-be-self-tested circuit 103, and the self-test of the to-be-self-tested circuit 103 can be correctly performed.

What is claimed is:

1. A semiconductor integrated circuit having a built-in self-test circuit, comprising:

a control signal producing circuit for receiving an external clock signal, receiving a first enabling signal which is asynchronous with the external clock signal and has a level change occurring just after or just before a particular level change of the external clock signal, producing a second enabling signal synchronized with the external clock signal on condition that a level of the second enabling signal is risen at a time which is later than a time of the particular level change of the external clock signal by a prescribed number of clocks of the external clock signal, and outputting the second enabling signal;

a synchronization circuit for receiving the external clock signal according to the level change of the first enabling signal, performing a reset operation in a reset time-period from the time of the particular level change of the external clock signal to the level rising time of the second enabling signal, receiving the second enabling signal produced by the control signal producing circuit, and producing a test signal synchronized with the external clock signal according to the second enabling signal; and first arithmetic logic means for receiving the second enabling signal produced by the control signal producing circuit and the test signal produced by the synchronization circuit, performing a logical multiply operation for the second enabling signal and the test signal to obtain the test signal as a result of the logical multiply operation, and outputting the test signal obtained as a result of the logical multiply operation to a to-be-self-tested circuit.

2. A semiconductor integrated circuit having a built-in self-test circuit according to claim 1, wherein the control signal producing circuit comprises a plurality of latch circuits arranged in series, the first enabling signal is used to set the latch circuits to an enabling condition, and the second enabling signal synchronized with the external clock signal is produced in the latch circuits set to the enabling condition according to the first enabling signal.

3. A semiconductor integrated circuit having a built-in self-test circuit according to claim 1, wherein the control signal producing circuit comprises:

a first system latch circuit having a plurality of first latch circuits arranged in series;

a second system latch circuit having a plurality of second latch circuits arranged in series;

second arithmetic logic means for performing a logical multiply for an output signal of the first system latch circuit and an output signal of the second system latch circuit; and a third latch circuit for latching an arithmetic result signal of the second arithmetic logic means to delay the arithmetic result signal and outputting the delayed arithmetic result signal as the second enabling signal synchronized with the external clock signal, the first enabling signal is used to set the first latch circuits of the first system latch circuit to an enabling condition, the level of the first enabling signal changing just before the particular level change of the external clock signal is latched in synchronization with the particular level change of the external clock signal in the first latch circuit placed on the first stage of the first system latch circuit, the first enabling signal is used to set the second latch circuits of the second system latch circuit to an enabling condition, and the level of the first enabling signal changing just after the particular level change of the external clock signal is latched in synchronization with a level change next to the particular level change of the external clock signal in the second latch circuit placed on the first stage of the second system latch circuit.

4. A semiconductor integrated circuit having a built-in self-test circuit according to claim 3, wherein the control signal producing circuit further comprises:

a selector circuit, connected with the third latch circuit, for maintaining the level of the second enabling signal to a low level until the level of the arithmetic result signal of the second arithmetic logic means is changed to a high level, and outputting the second enabling signal set to a high level after the reset time-period passes.

5. A semiconductor integrated circuit having a built-in self-test circuit according to claim 4, wherein the control signal producing circuit further comprises:

a counter, arranged between the second arithmetic logic means and the third latch circuit, for delaying the arithmetic result signal of the second arithmetic logic means by a second prescribed number of clocks of the external clock signal to prolong the reset time-period, and outputting the delayed arithmetic result signal to the third latch circuit.

6. A semiconductor integrated circuit having a built-in self-test circuit according to claim 1, further comprising a clock signal supplying circuit for supplying the external clock signal to the synchronization circuit and the control signal producing circuit and supplying an internal clock signal to the to-be-self-tested circuit, wherein the clock signal supplying circuit comprises:

a first logical circuit for receiving the external clock signal and outputting the external clock signal to the to-be-self-tested circuit as the internal clock signal in cases where the first enabling signal is set to a first level; and a second logical circuit for receiving the external clock signal and the first enabling signal and outputting the external clock signal to the synchronization circuit and the control signal producing circuit in cases where the first enabling signal is set to a second level.

7. A semiconductor integrated circuit having a built-in self-test circuit according to claim 6, further comprising:

a delaying circuit for delaying the external clock signal output from the second logical circuit of the clock signal supplying circuit to the synchronization circuit by a prescribed time-period to prevent a clock skew between the test signal produced in the synchronization circuit and the internal clock signal output from the first logical circuit of the clock signal supplying circuit.

* * * * *